US012753508B2

(12) United States Patent
Wu et al.

(10) Patent No.: US 12,753,508 B2
(45) Date of Patent: Oct. 6, 2026

(54) HEATING APPARATUS AND CHEMICAL VAPOR DEPOSITION SYSTEM

(71) Applicant: PlayNitride Display Co., Ltd., MiaoLi County (TW)

(72) Inventors: Jyun-De Wu, MiaoLi County (TW); Yen-Lin Lai, MiaoLi County (TW); Chi-Heng Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 629 days.

(21) Appl. No.: 18/342,727

(22) Filed: Jun. 27, 2023

(65) Prior Publication Data

US 2023/0340669 A1 Oct. 26, 2023

Related U.S. Application Data

(63) Continuation-in-part of application No. 16/878,582, filed on May 19, 2020, now abandoned.

(30) Foreign Application Priority Data

Nov. 6, 2019 (TW) ................................ 108140232

(51) Int. Cl.
*C23C 16/46* (2006.01)
*C23C 16/458* (2006.01)

(52) U.S. Cl.
CPC .......... *C23C 16/46* (2013.01); *C23C 16/4584* (2013.01)

(58) Field of Classification Search
CPC .... C23C 16/46; C23C 16/4584; H01L 33/005
USPC .......................................................... 118/725
See application file for complete search history.

(56) References Cited

U.S. PATENT DOCUMENTS

| | | | | | |
|---|---|---|---|---|---|
| 6,072,162 | A * | 6/2000 | Ito | H10P 72/0434 | 118/725 |
| 6,768,084 | B2 * | 7/2004 | Liu | H10P 72/0602 | 118/724 |
| 10,138,551 | B2 * | 11/2018 | Colvin | C23C 16/46 | |
| 2011/0073039 | A1 * | 3/2011 | Colvin | C23C 16/46 | 219/490 |
| 2011/0185969 | A1 * | 8/2011 | Yang | C23C 16/481 | 118/666 |
| 2016/0204008 | A1 * | 7/2016 | Brien | C30B 25/10 | 219/634 |

* cited by examiner

*Primary Examiner* — Charlee J. C. Bennett
(74) *Attorney, Agent, or Firm* — JCIPRNET

(57) ABSTRACT

A heating apparatus including a rotating stage, a plurality of wafer carriers, a plurality of first heaters, and at least one second heater is provided. The plurality of wafer carriers is disposed on the rotating stage. The rotating stage drives the wafer carriers to rotate around a rotating axis of the rotating stage. The plurality of first heaters is disposed under a first heating region, each have a first width Wa. There is a first spacing Sa between any two adjacent first heaters. The at least one second heater is disposed under a second heating region, and has a second width Wb. There is a smallest spacing Sab between the at least one second heater and the first heating region, and Wa, Wb, Sa and Sab satisfy the equation: Wa/(Wa+Sa)≥Wb/(Wb+Sab). Each wafer carrier overlaps the first heating region in the axial direction of the rotating axis.

12 Claims, 12 Drawing Sheets

100D

HEATING APPARATUS AND CHEMICAL VAPOR DEPOSITION SYSTEM

CROSS-REFERENCE TO RELATED APPLICATION

This application is a continuation-in-part application of and claims the priority benefit of U.S. application Ser. No. 16/878,582, filed on May 19, 2020, now pending, which claims the priority benefit of Taiwan application serial no. 108140232, filed on Nov. 6, 2019. The entirety of each of the above-mentioned patent applications is hereby incorporated by reference herein and made a part of this specification.

BACKGROUND OF THE INVENTION

Field of the Invention

The disclosure relates to a film deposition apparatus, and in particular, to a heating apparatus and a chemical vapor deposition (CVD) system.

Description of Related Art

With continuous improvements in operating performance and reliability of light-emitting diode materials, the light-emitting diode materials are gradually applied to diversified fields, for example, lighting devices, displays, and backlight modules. To satisfy performance specifications under various different usage requirements, light-emitting diode elements of different structures or materials continuously challenge design and mass production capabilities of relevant manufacturers. For example, to meet a required display quality (for example, color rendering or brightness uniformity of a display surface) requirement, film thickness uniformity of an epitaxial layer of a micro light-emitting diode applied to a display needs to be better.

In a process of forming an epitaxial film of a micro light-emitting diode element, a CVD technology is one of the commonly used technical means. However, as the size of the epitaxial substrate increases and the size of the light-emitting diode element decreases, the traditional CVD device can no longer satisfy the temperature uniformity requirement of the epitaxial substrate during film formation.

SUMMARY OF THE INVENTION

The invention provides a heating apparatus, which may provide favorable temperature uniformity of an epitaxial substrate.

The invention provides a CVD system, which has favorable film uniformity.

The heating apparatus of the invention includes a rotating stage, a plurality of wafer carriers, a plurality of first heaters, and at least one second heater. The rotating stage includes a rotating axis. The plurality of wafer carriers is disposed on the rotating stage. The rotating stage drives the wafer carriers to rotate on the rotating axis. The plurality of first heaters is disposed under a first heating region. There is a first spacing Sa between any two adjacent first heaters. The first heaters each include a first width Wa in a radial direction of the rotating stage. The at least one second heater is disposed under a second heating region. The second heater includes a second width Wb in the radial direction of the rotating stage, and the first width Wa is equal to the second width Wb. There is a smallest spacing Sab between the at least one second heater and the first heating region, and Wa, Wb, Sa and Sab satisfy the equation: $Wa/(Wa+Sa) \geq Wb/(Wb+Sab)$. A vertical projection of each of the wafer carriers on the rotating stage overlaps a vertical projection of the first heating region on the rotating stage.

In an embodiment of the invention, the first heating region of the heating apparatus includes a radial width in the radial direction of the rotating stage. The wafer carrier includes a wafer carrier diameter, and a ratio of the radial width to the wafer carrier diameter is greater than 0.5 and less than 1.

In an embodiment of the invention, the second heating region of the heating apparatus includes a plurality of second heaters, there is a second spacing Sb between any two adjacent second heaters, and Wa, Wb, Sa and Sb satisfy the equation: $Wa/(Wa+Sa) \geq Wb/(Wb+Sb)$.

In an embodiment of the invention, the plurality of first heaters of the heating apparatus includes a first temperature, the second heater includes a second temperature, and the first temperature is not equal to the second temperature.

In an embodiment of the invention, the plurality of wafer carriers of the heating apparatus includes a symmetry center each, and the symmetry centers overlap a vertical projection of the first heating region on the wafer carriers.

In an embodiment of the invention, the heating apparatus further includes at least one third heater disposed under a third heating region, at least part of the third heating region does not overlap the rotating stage, the third heater comprises a third width Wc in the radial direction of the rotating stage, there is a smallest spacing Sac between the at least one third heater and the first heating region, and Wa, Wc, Sa and Sac satisfy the equation: $Wa/(Wa+Sa) > Wc/(Wc+Sac)$.

In an embodiment of the invention, the heating apparatus further includes at least one fourth heater disposed under a fourth heating region, the fourth heating region does not overlap the rotating stage, the fourth heater comprises a fourth width Wd in the radial direction of the rotating stage, there is a smallest spacing Sbd between the at least one fourth heater and the second heating region, there is a distance H between the rotating stage and the at least one fourth heater in an axial direction of the rotating axis, and Wd, Sbd, Wb, Sab and H satisfy the equation: $Wb/(Wb+Sab) \geq Wd/[(Wd+Sbd) \cdot H^{n1}]$, where n1 is greater than 0.

In an embodiment of the invention, the rotating stage of the heating apparatus further includes an opening disposed between the wafer carriers, the rotating axis passes through the opening, and the at least one fourth heater completely overlaps the opening in the axial direction of the rotating axis.

In an embodiment of the invention, the heating apparatus further includes at least one fifth heater disposed under a fifth heating region, the fifth heating region does not overlap the rotating stage, the fifth heater comprises a fifth width We in the radial direction of the rotating stage, there is a smallest spacing Sce between the at least one fifth heater and the third heating region, and We, Sce, Wc, Sac and H satisfy the equation: $Wc/(Wc+Sac) > We/[(We+Sce) \cdot H^{n2}]$, where n2 is greater than 0.

In an embodiment of the invention, there is a distance H1 between the rotating stage and the first heaters of the heating apparatus in an axial direction of the rotating axis, there is a distance H2 between the rotating stage and the at least one second heater of the heating apparatus in the axial direction of the rotating axis, and the distance H1 is different from the distance H2.

The CVD system of the invention includes a chamber, a heating apparatus, a rotation driving mechanism, and an air inlet unit. The heating apparatus is disposed in the chamber. The heating apparatus includes a rotating stage, a plurality of wafer carriers, a plurality of first heaters, and at least one second heater. The rotating stage includes a rotating axis. The plurality of wafer carriers is disposed on the rotating stage. The rotating stage drives the wafer carriers to rotate on the rotating axis. The first heaters are disposed under a first heating region. There is a first spacing Sa between any two adjacent first heaters. The first heaters each include a first width Wa in a radial direction of the rotating stage. The at least one second heater is disposed under a second heating region. The second heater includes a second width Wb in the radial direction of the rotating stage, and the first width Wa is equal to the second width Wb. There is a smallest spacing Sab between the at least one second heater and the first heating region, and Wa, Wb, Sa and Sab satisfy the equation: $Wa/(Wa+Sa)>Wb/(Wb+Sab)$. The rotation driving mechanism is connected to the rotating stage and drives the rotating stage to rotate. The air inlet unit is disposed in the chamber and located above the rotating stage. A vertical projection of each of the wafer carriers on the rotating stage overlaps a vertical projection of the first heating region on the rotating stage.

In an embodiment of the invention, the second heating region of the CVD system includes a plurality of second heaters, there is a second spacing Sb between any two adjacent second heaters, and Wa, Wb, Sa and Sb satisfy the equation: $Wa/(Wa+Sa)\geq Wb/(Wb+Sb)$.

In an embodiment of the invention, the plurality of first heaters of the CVD system includes a first temperature, the second heater includes a second temperature, and the first temperature is not equal to the second temperature.

In an embodiment of the invention, the heating apparatus of the CVD system further includes at least one third heater disposed under a third heating region, at least part of the third heating region does not overlap the rotating stage, the third heater comprises a third width Wc in the radial direction of the rotating stage, there is a smallest spacing Sac between the at least one third heater and the first heating region, and Wa, Wc, Sa and Sac satisfy the equation: $Wa/(Wa+Sa)\geq Wc/(Wc+Sac)$.

In an embodiment of the invention, the heating apparatus of the CVD system further includes at least one fourth heater disposed under a fourth heating region, fourth heating region does not overlap the rotating stage, the fourth heater comprises a fourth width Wd in the radial direction of the rotating stage, there is a smallest spacing Sbd between the at least one fourth heater and the second heating region, there is a distance H between the rotating stage and the at least one fourth heater in an axial direction of the rotating axis, and Wd, Sbd, Wb, Sab and H satisfy the equation: $Wb/(Wb+Sab)\geq Wd/[(Wd+Sbd)\cdot H^{n1}]$, where n1 is greater than 0.

In an embodiment of the invention, the rotating stage of the heating apparatus of the CVD system further includes an opening disposed between the wafer carriers, the rotating axis passes through the opening, and the at least one fourth heater completely overlaps the opening in the axial direction of the rotating axis.

In an embodiment of the invention, the heating apparatus of the CVD system further includes at least one fifth heater disposed under a fifth heating region, the fifth heating region does not overlap the rotating stage in the axial direction of the rotating axis, the fifth heater comprises a fifth width We in the radial direction of the rotating stage, there is a smallest spacing Sce between the at least one fifth heater and the third heating region, and We, Sce, Wc, Sac and H satisfy the equation: $Wc/(Wc+Sac)>We/[(We+Sce)\cdot H^{n2}]$, where n2 is greater than 0.

In an embodiment of the invention, there is a distance H1 between the rotating stage and the first heaters of the heating apparatus of the CVD system in an axial direction of the rotating axis, there is a distance H2 between the rotating stage and the at least one second heater of the heating apparatus of the CVD system in the axial direction of the rotating axis, and the distance H1 is different from the distance H2.

Based on the above, in the heating apparatus and the CVD system in an embodiment of the invention, the first spacing between two adjacent first heaters located in the first heating region is not equal to the spacing between the first heating region and the second heating region, so that temperature uniformity of an epitaxial substrate can be effectively improved, a film developed on the epitaxial substrate may have favorable thickness uniformity, and uniformity of light emission of a subsequently formed micro light-emitting diode chip is also improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
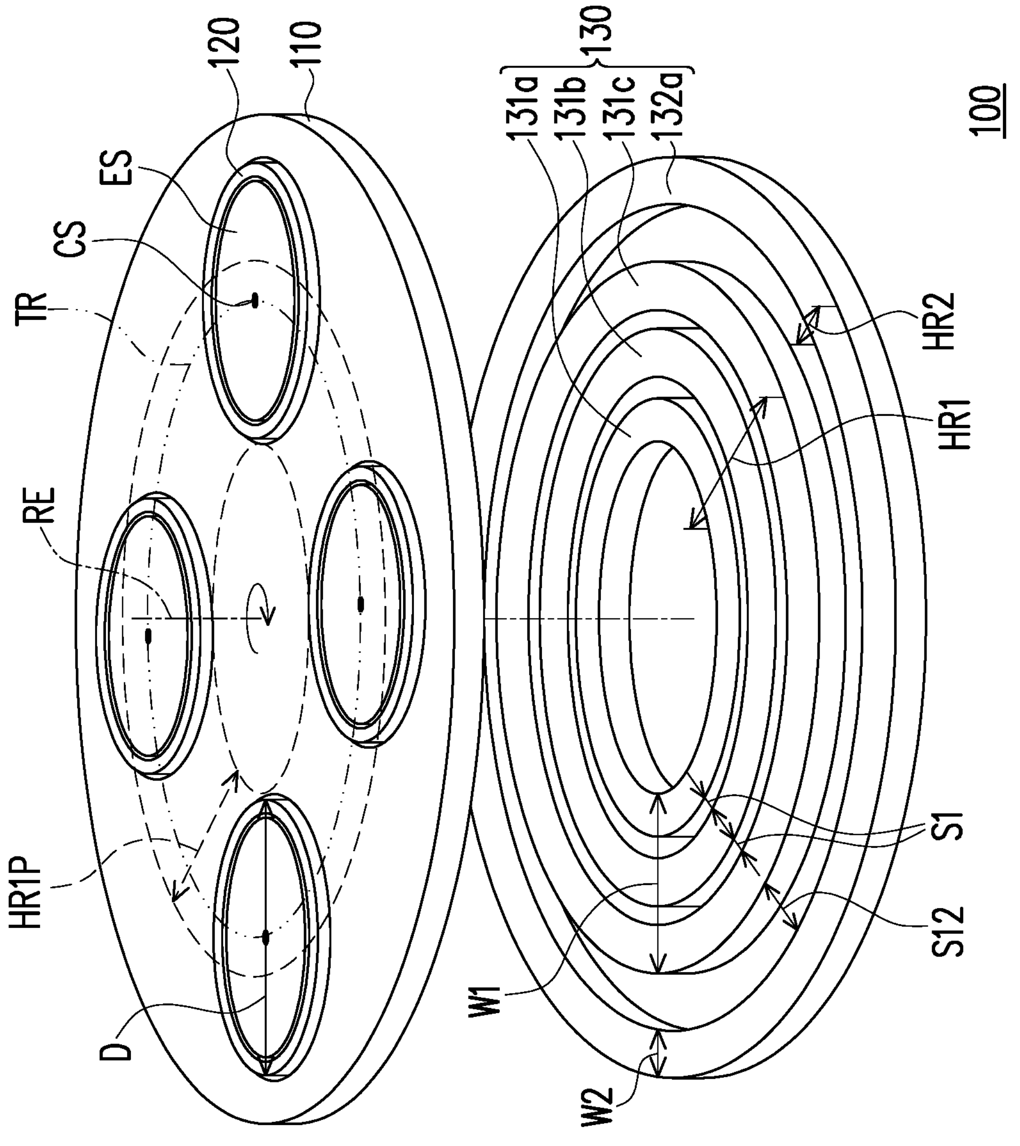
FIG. 1 is a schematic partial exploded view of a heating apparatus according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
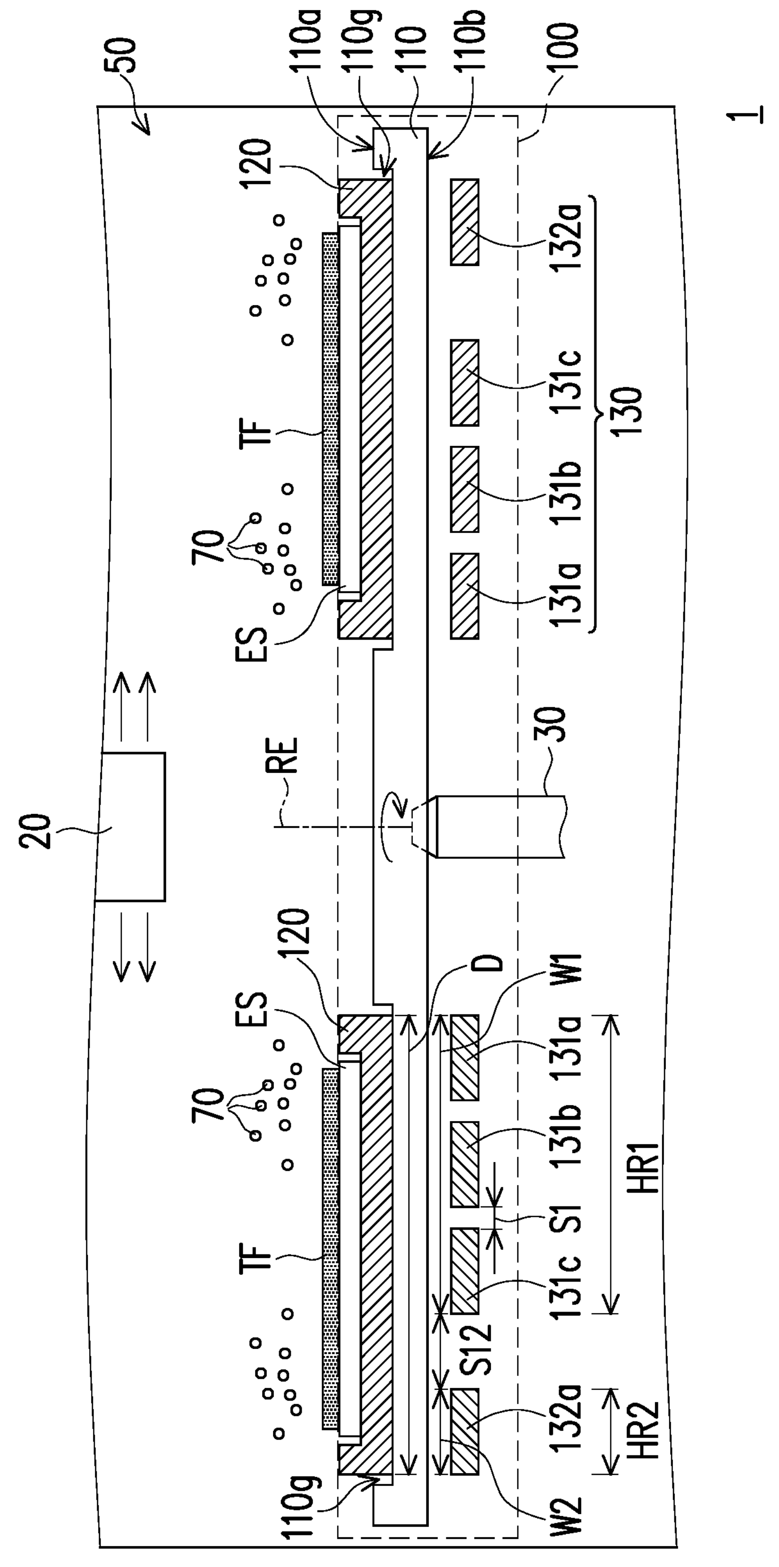
FIG. 2 is a schematic cross-sectional view of a CVD system according to an embodiment of the invention.

FIG. 1 is a schematic partial exploded view of a heating apparatus according to a first embodiment of the invention. FIG. 2 is a schematic cross-sectional view of a CVD system according to an embodiment of the invention. Referring to FIG. 1 and FIG. 2, the CVD system 1 includes a chamber 50, a heating apparatus 100, an air inlet unit 20, and a rotation driving mechanism 30. The heating apparatus 100 includes a rotating stage 110, a plurality of wafer carriers 120, and a heater 130. The wafer carrier 120 is configured to position an epitaxial substrate ES on the rotating stage 110. The wafer carrier 120 and the heater 130 are respectively disposed on two opposite sides of the rotating stage 110. Specifically, the rotating stage 110 includes a first surface 110*a* and a second surface 110*b* that are opposite and a plurality of grooves 110*g* provided on the first surface 110*a*. These wafer carriers 120 are respectively disposed in these grooves 110*g*, and protruding from the first surface 110*a* of the rotating stage 110. The second surface 110*b* of the rotating stage 110 is facing the heater 130.

In the present embodiment, for example, there are four wafer carriers 120, but this does not indicate that the invention is limited by the content disclosed in the figure. In other embodiments, the number of the wafer carriers 120 may be adjusted according to an actual process requirement (for example, the size of the epitaxial substrate or the rotating stage). The heating apparatus 100 is disposed in the chamber 50. The rotation driving mechanism 30 is linked to the rotating stage 110 to drive the rotating stage 110 to rotate. The air inlet unit 20 is connected to the chamber 50 and located above the rotating stage 110. In the present embodiment, the air flows into the chamber 50 from two sides of the air inlet unit 20, but is not limited thereto. In other embodiments, an air inlet opening may also be disposed below the air inlet unit 20. During film formation, the heating apparatus 100 may maintain a surface temperature of the epitaxial substrate ES at a predetermined value, the rotation driving mechanism 30 is used to drive the rotating stage 110 to maintain a rotation speed. Meanwhile, a process gas 70 (for example, a vaporized precursor or other reaction gases) is delivered to the chamber 50 through the air inlet unit 20, and a required epitaxial film TF is formed on the epitaxial substrate ES through chemical reaction of these process gases 70. In the present embodiment, the epitaxial substrate ES is, for example, a silicon wafer, a sapphire substrate, a silicon carbide (SiC) substrate, or other suitable substrates, and the epitaxial film TF is, for example, a gallium nitride (GaN) film, but is not limited thereto.

Further, the rotating stage 110 also includes a rotating axis RE, and each of these wafer carriers 120 is driven by the rotating stage 110 to rotate on the rotating axis RE. In the present embodiment, for example, there are four heaters 130, namely, a first heater 131*a*, a first heater 131*b*, a first heater 131*c*, and a second heater 132*a*, and the first heater 131*a*, the first heater 131*b*, the first heater 131*c*, and the second heater 132*a* are sequentially disposed away from a radial direction of the rotating stage 110, but the invention is not limited thereto. In other embodiments, alternatively, the second heater 132*a* may be located between the first heater and the rotating axis RE. From another point of view, the first heater 131*a*, the first heater 131*b*, and the first heater 131*c* may define a first heating region HR1, the second heater 132*a* may define a second heating region HR2, and in the radial direction of the rotating stage 110, the first heating region HR1 is optionally located between the second heating region HR2 and the rotating axis RE, but is not limited thereto.

It should be noted that, there is a first spacing S1 between any two adjacent first heaters (for example, the first heater 131*a* and the first heater 131*b* or the first heater 131*b* and the first heater 131*c*) located in the first heating region HR1 in the radial direction of the rotating stage 110. There is a spacing S12 between the first heating region HR1 and the second heating region HR2 in the radial direction of the rotating stage 110, and the spacing S12 is not equal to the first spacing S1. In the present embodiment, the spacing S12 is the smallest spacing between the second heater 132*a* and the first heater 131*c* that are adjacent. For example, the spacing S12 may be optionally greater than the first spacing S1, but is not limited thereto. In the present embodiment, vertical projections of these heaters 130 on the rotating stage 110 may surround the rotating axis RE. However, the invention is not limited thereto. According to other embodiments, the heater may include a plurality of separated segments, and these segments are respectively disposed in a plurality of sections overlapping rotation paths of these wafer carriers 120.

In addition, the wafer carrier 120 includes a symmetry center CS, and the rotating stage 110 rotates to drive the symmetry center CS to form a rotation track TR surrounding the rotating axis RE. It is specially noted that, in an axial direction of the rotating axis RE, the rotation track TR overlaps a vertical projection HR1P of the first heating region HR1 on the rotating stage 110. In other words, in a rotation process of the wafer carrier 120, the symmetry center CS of the wafer carrier 120 always overlaps the vertical projection HR1P of the first heating region HR1 on the wafer carrier 120. In the present embodiment, rotation paths of the plurality of wafer carriers 120 roughly overlap each other (that is, the rotation tracks TR of the symmetry centers CS of these wafer carriers 120 roughly overlap each other), but the invention is not limited thereto. In other embodiments, alternatively, the rotation tracks TR of the symmetry centers CS of these wafer carriers 120 may be staggered from each other.

The first heating region HR1 includes a radial width W1 in the radial direction of the rotating stage 110, and the wafer carrier 120 includes a wafer carrier diameter D in the radial direction of the rotating stage 110 (that is, the radial direction of the rotating stage 110 herein passes through the symmetry center CS of the wafer carrier 120). It is specially noted that, a ratio of the radial width W1 of the first heating region HR1 to the wafer carrier diameter D of the wafer carrier 120 may be greater than 0.5 and less than 1. Therefore, the first heater 131*a*, the first heater 131*b*, and the first heater 131*c* located in the first heating region HR1 may heat only a partial region of the wafer carrier 120, helping improve temperature uniformity of the epitaxial substrate ES, and enabling the epitaxial film TF developed on the epitaxial substrate ES to have favorable thickness uniformity. In some embodiments, a ratio of a vertical projection area of the first heating region HR1 on the wafer carrier 120 to an area of the wafer carrier 120 may be greater than or equal to 0.4 and less than or equal to 0.9, helping further improve the temperature uniformity of the epitaxial substrate ES.

Further, the second heating region HR2 also partially overlaps the wafer carrier 120 in the axial direction of the rotating axis RE, the second heating region HR2 includes a radial width W2 in the radial direction of the rotating stage 110, and the radial width W2 is not equal to the radial width W1 of the first heating region HR1. More specifically, the radial width W2 of the second heating region HR2 is less than the radial width W1 of the first heating region HR1. In the present embodiment, the first heater 131*a*, the first heater 131*b*, and the first heater 131*c* each have a first temperature, the second heater 132*a* has a second temperature, and the first temperature is not equal to the second temperature, so that the heater 130 can heat a plurality of regions of the wafer carrier 120, helping improve the temperature uniformity of the epitaxial substrate ES, and enabling the epitaxial film TF developed on the epitaxial substrate ES to have favorable thickness uniformity. It should be understood that, in the present embodiment, the epitaxial substrate ES may be heated through thermal radiation and thermal conduction. More specifically, thermal energy provided by the heater 130 may be transmitted to the second surface 110*b* of the rotating stage 110 through thermal radiation, and then transmitted to the epitaxial substrate ES through thermal conduction of the rotating stage 110 and the wafer carrier 120, but the invention is not limited thereto.

The following is to list some other embodiments to describe the disclosure in detail, the same components are to be marked with the same symbols, and descriptions of the same technical content are omitted. For the omitted part, refer to the above embodiments, and the descriptions thereof are omitted below.

Figure 3:
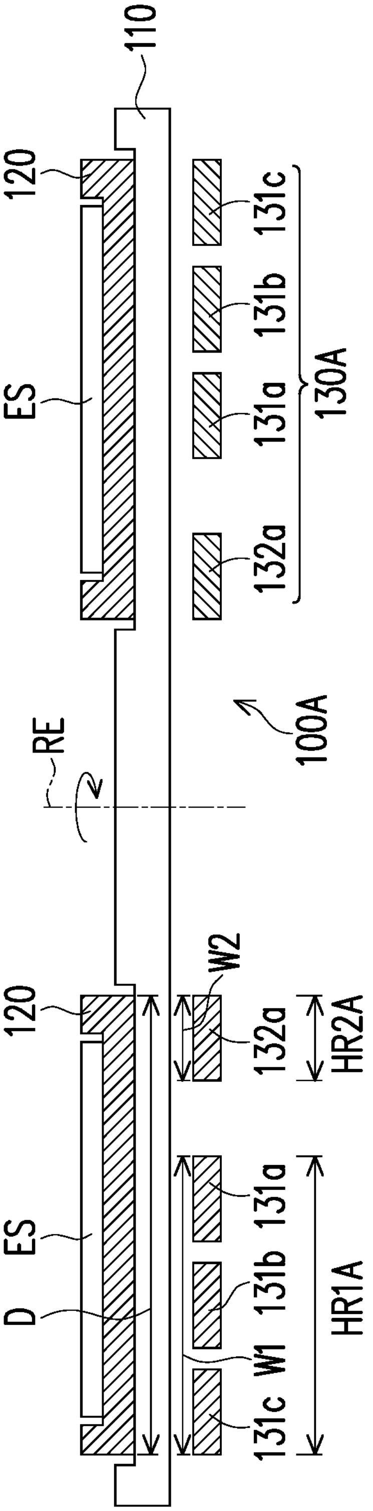
FIG. 3 is a schematic cross-sectional view of a heating apparatus according to a second embodiment of the invention.

FIG. 3 is a schematic cross-sectional view of a heating apparatus according to a second embodiment of the invention. Referring to FIG. 3, a main difference between the heating apparatus 100A in the present embodiment and the heating apparatus 100 in FIG. 2 is that the heater is configured in different manners. Specifically, in the radial direction of the rotating stage 110, a second heating region HR2A is optionally disposed between a first heating region HR1A and the rotating axis RE. That is, the second heater 132*a* may be located between the first heater and the rotating axis RE. In the present embodiment, a configuration relationship between the first heating region HR1A and the wafer carrier 120 is similar to that of the heating apparatus 100 in the foregoing embodiment, and the descriptions thereof are omitted herein.

It is specially noted that, a ratio of a radial width W1 of the first heating region HR1A to the wafer carrier diameter D of the wafer carrier 120 is greater than 0.5 and less than 1. Therefore, the first heater 131*a*, the first heater 131*b*, and the first heater 131*c* may heat only a partial region of the wafer carrier 120, helping improve temperature uniformity of the epitaxial substrate ES, and enabling the epitaxial film TF developed on the epitaxial substrate ES to have favorable thickness uniformity. In addition, the second heating region HR2A has a radial width W2 in the radial direction of the rotating stage 110, and the radial width W2 is not equal to the radial width W1 of the first heating region HR1A. More specifically, the radial width W2 of the second heating region HR2A is less than the radial width W1 of the first heating region HR1A. In the present embodiment, the first heater 131*a*, the first heater 131*b*, and the first heater 131*c* each have a first temperature, the second heater 132*a* has a second temperature, and the first temperature is not equal to the second temperature, so that the heater 130A can heat a plurality of regions of the wafer carrier 120, helping improve the temperature uniformity of the epitaxial substrate ES, and enabling the epitaxial film TF developed on the epitaxial substrate ES to have favorable thickness uniformity.

Figure 4:
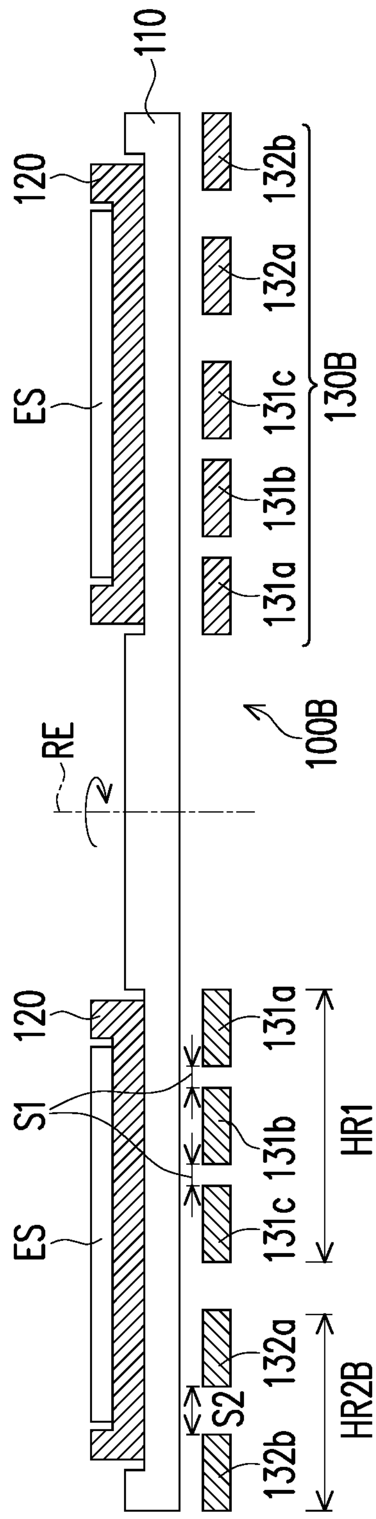
FIG. 4 is a schematic cross-sectional view of a heating apparatus according to a third embodiment of the invention.
Figure 5:
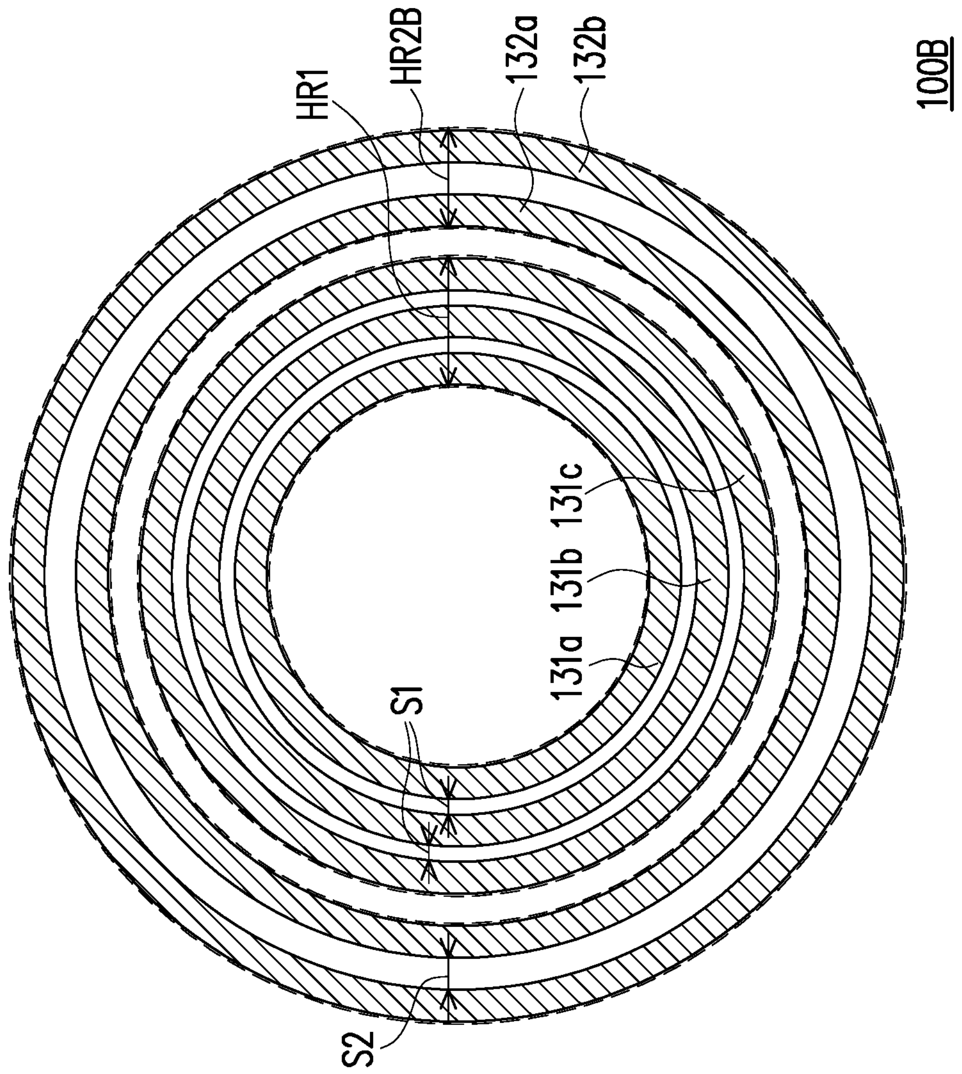
FIG. 5 is a schematic top view of the heating apparatus in FIG. 4.

FIG. 4 is a schematic cross-sectional view of a heating apparatus according to a third embodiment of the invention. FIG. 5 is a schematic top view of the heating apparatus in FIG. 4. It is specially noted that, for clear presentation, FIG. 5 shows only the heater 130B and the heating regions in FIG. 4. Referring to FIG. 4 and FIG. 5, a main difference between the heating apparatus 100B in the present embodiment and the heating apparatus 100 in FIG. 2 is that the number of the second heaters is different. In the present embodiment, for example, the heating apparatus 100B includes two second heaters, namely, a second heater 132*a* and a second heater 132*b*. In the radial direction of the rotating stage 110, the second heater 132*b* is disposed on a side of the second heater 132*a* away from the rotating axis RE. In the present embodiment, a configuration relationship between the first heater 131*a*, the first heater 131*b*, the first heater 131*c*, the second heater 132*a*, and the wafer carrier 120 is similar to that of the heating apparatus 100, and descriptions thereof are omitted herein.

Further, there is a second spacing S2 between the second heater 132*a* and the second heater 132*b* located in the second heating region HR2B in the radial direction of the rotating stage 110, and the second spacing $2 is not equal to the first spacing S1 between any two adjacent first heaters. For example, the second spacing S2 is optionally greater than the first spacing S1, but is not limited thereto. It should be noted that, a ratio of a vertical projection area of the first heater 131*a*, the first heater 131*b*, and the first heater 131*c* on the rotating stage 110 to a vertical projection area of the first heating region HR1 on the rotating stage 110 is not equal to a ratio of a vertical projection area of the second heater 132*a* and the second heater 132*b* on the rotating stage 110 to a vertical projection area of the second heating region HR2B on the rotating stage 110. That is, the distribution density of the heaters located in the first heating region HR1 is not equal to the distribution density of the heaters located in the second heating region HR2B. In this way, the heater 130B can heat a plurality of regions of the wafer carrier 120, thereby improving the temperature uniformity of the epitaxial substrate ES.

In addition, the first heater 131*a*, the first heater 131*b*, and the first heater 131*c* may each have a first temperature, the second heater 132*a* and the second heater 132*b* may each have a second temperature, and the first temperature is not equal to the second temperature, helping improve the temperature uniformity of the epitaxial substrate ES, and enabling the epitaxial film TF developed on the epitaxial substrate ES to have favorable thickness uniformity.

Figure 6:
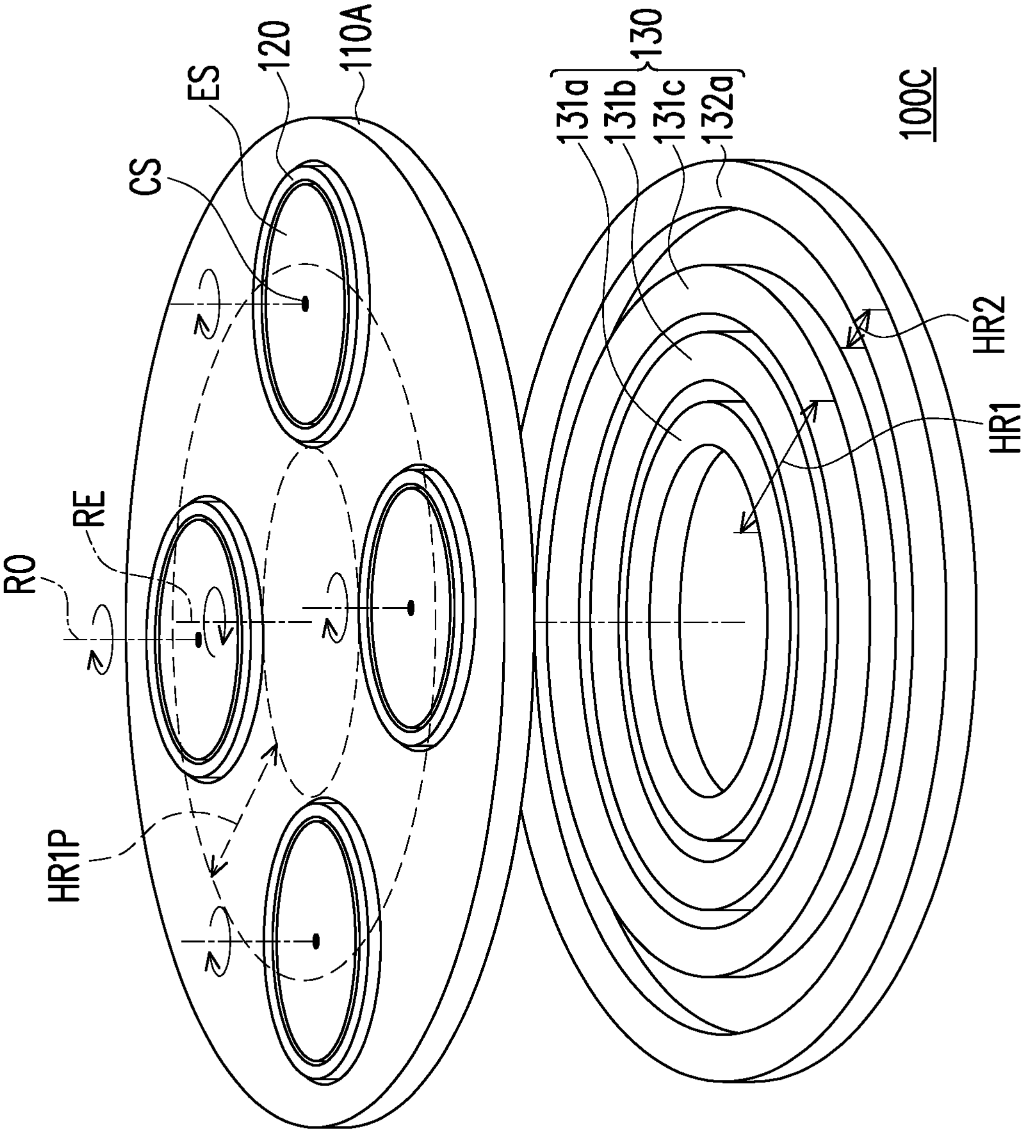
FIG. 6 is a schematic partial exploded view of a heating apparatus according to a fourth embodiment of the invention.
Figure 7:
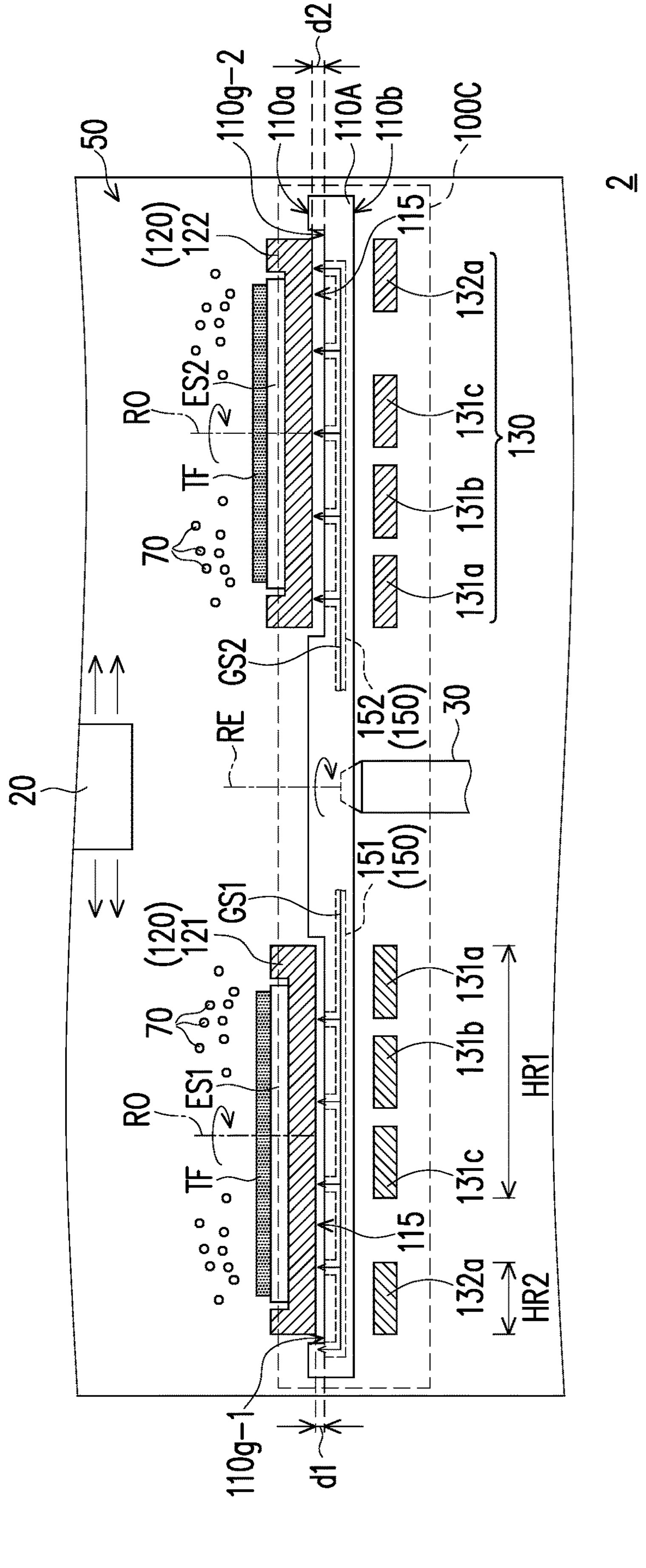
FIG. 7 is a schematic cross-sectional view of a CVD system according to another embodiment of the invention.

FIG. 6 is a schematic cross-sectional view of a heating apparatus according to a fourth embodiment of the invention. FIG. 7 is a schematic cross-sectional view of a CVD system according to another embodiment of the invention. It is specially noted that, for clear presentation, a wafer carrier driving unit 150 of FIG. 7 is omitted in FIG. 6.

Referring to FIG. 6 and FIG. 7, a main difference between a CVD system 2 and a heating apparatus 100C in the present embodiment and the CVD system 1 and the heating apparatus 100 in FIG. 2 is that the heating apparatus 100C further includes the wafer carrier driving unit 150, configured to drive the wafer carrier 120 to spin on a spinning axis RO, where the spinning axis RO passes through the symmetry center CS of the wafer carrier 120. In the present embodiment, the wafer carrier driving unit 150 includes a plurality of gas pipelines disposed in a rotating stage 110A, for example, a gas pipeline 151 and a gas pipeline 152, and the gas pipelines are located below the wafer carrier 120. These gas pipelines are configured to deliver an airflow to grooves (for example, a groove 110*g*-1 and a groove 110*g*-2) of the rotating stage 110A to flow between the wafer carrier 120 and the rotating stage 110A, so that a spacing 115 is formed between the wafer carrier 120 disposed in the grooves and the first surface 110*a* of the rotating stage 110A in the axial direction of the rotating axis RE, and the airflow drives the wafer carrier 120 to rotate. In this way, the temperature uniformity in the epitaxial substrate ES can be further improved. It should be noted that, in the present embodiment, a rotation direction and a spinning direction of the wafer carrier 120 are optionally the same (for example, are a clockwise direction), but the invention is not limited thereto. In other embodiments, alternatively, the rotation direction and the spinning direction of the wafer carrier 120 may be respectively a clockwise direction and a counter-clockwise direction.

In the present embodiment, the wafer carrier driving unit 150 delivers a first airflow GS1 to the groove 110*g*-1 in which the wafer carrier 121 is disposed, so that there is a first distance d1 between the wafer carrier 121 and the rotating stage 110A in the axial direction of the rotating axis RE. The wafer carrier driving unit 150 delivers a second airflow GS2 to the groove 110*g*-2 in which the wafer carrier 122 is disposed, so that there is a second distance d2 between the wafer carrier 122 and the rotating stage 110A in the axial direction of the rotating axis RE. Relative amounts of the first airflow GS1 and the second airflow GS2 are adjusted, so that the first distance d1 between the wafer carrier 121 and the rotating stage 110A is not equal to the second distance d2 between the wafer carrier 122 and the rotating stage 110A. For example, when there is a temperature difference between an epitaxial substrate ES1 and an epitaxial substrate ES2, a unit time flow of the first airflow GS1 is set to be less than a unit time flow of the second airflow GS2, to make the first distance d1 less than the second distance d2, to further reduce the temperature difference between the two epitaxial substrates. Alternatively, spinning speeds of these wafer carriers may be adjusted by using different airflows to improve film uniformity and improve epitaxial quality.

Figure 8:
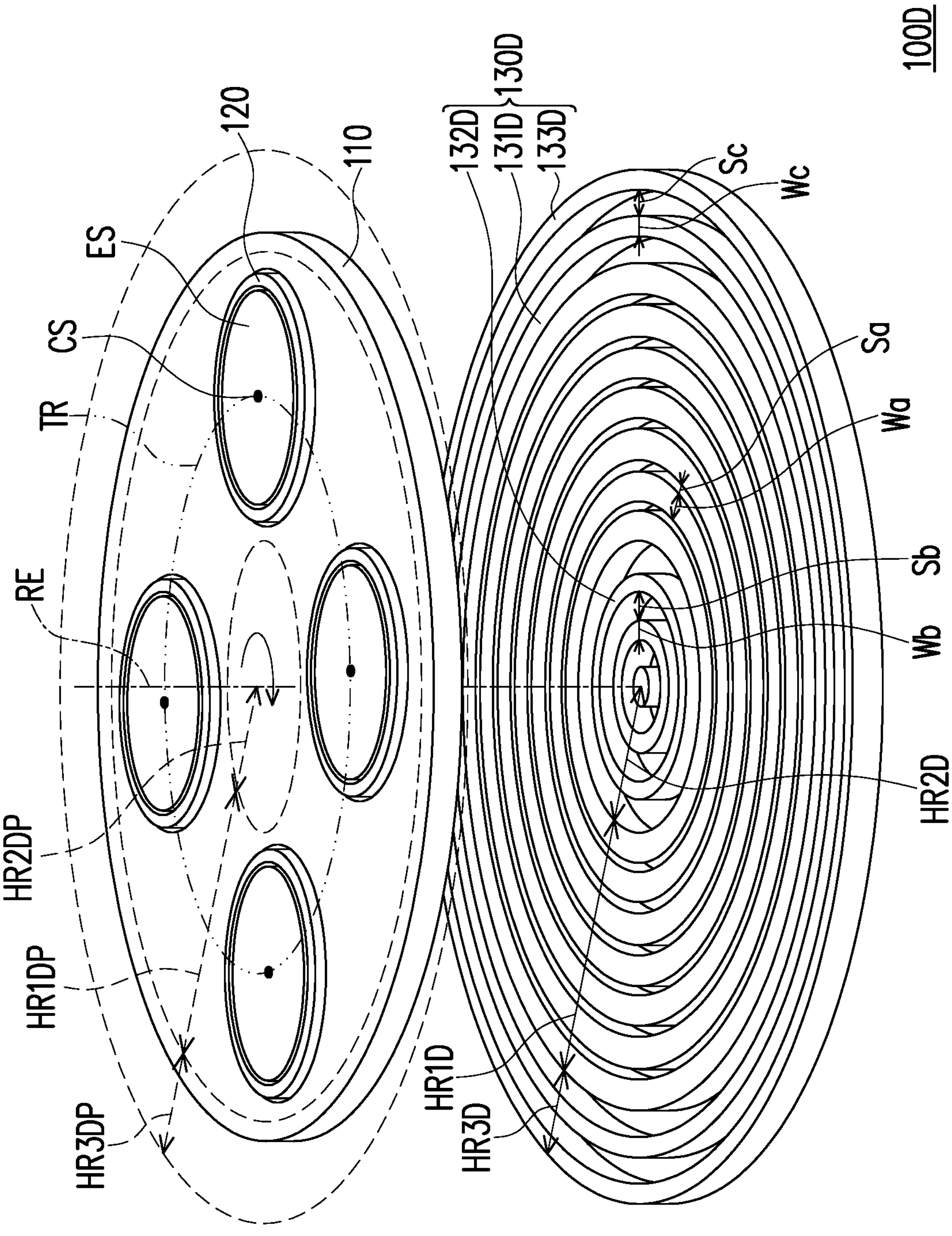
FIG. 8 is a schematic partial exploded view of a heating apparatus according to a fifth embodiment of the invention.
Figure 9:
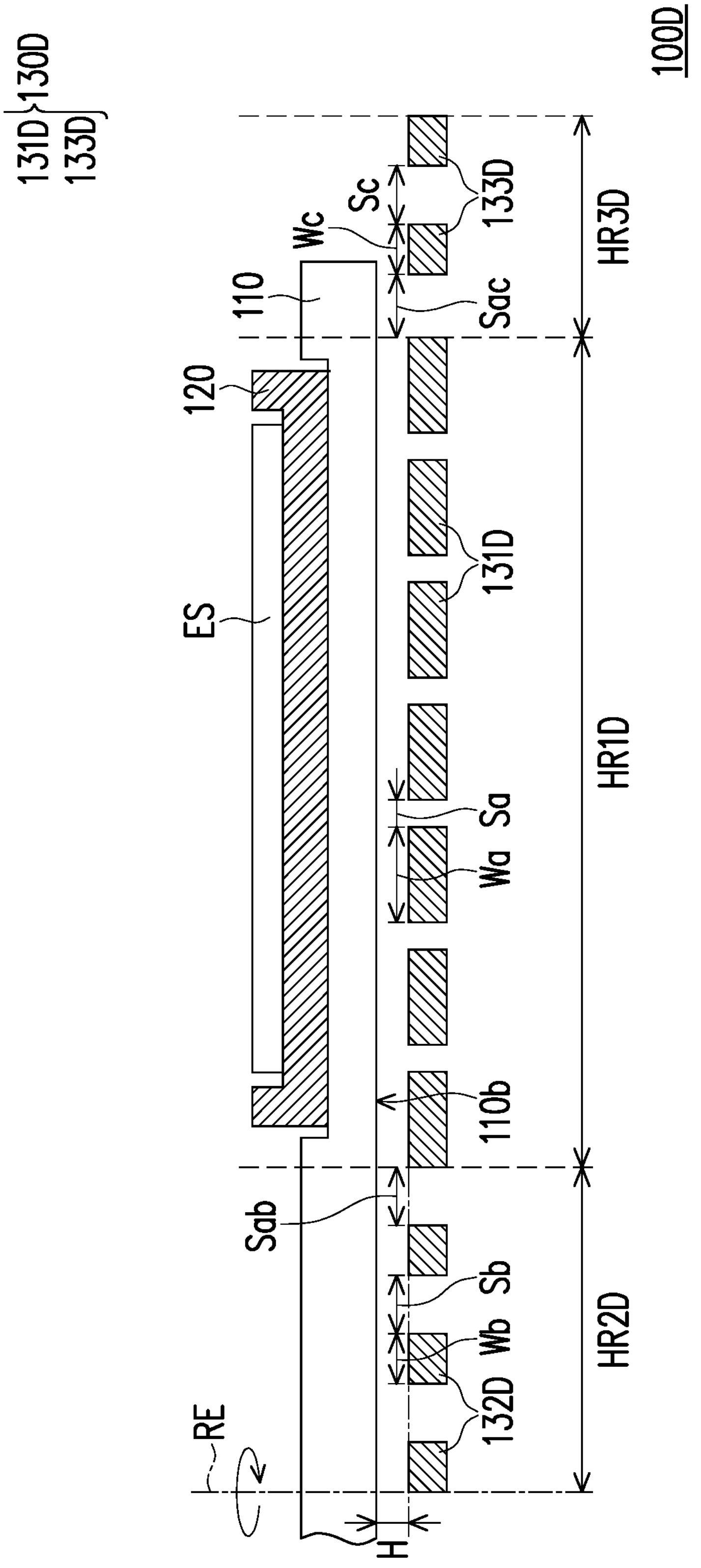
FIG. 9 is a schematic cross-sectional view of the heating apparatus in FIG. 8.

FIG. 8 is a schematic partial exploded view of a heating apparatus according to a fifth embodiment of the invention. FIG. 9 is a schematic cross-sectional view of the heating apparatus in FIG. 8. Referring to FIG. 8 and FIG. 9, a main difference between the heating apparatus 100D in the present embodiment and the heating apparatus 100A in FIG. 3 is that the heater is configured in different manners.

In the present embodiment, the wafer carriers 120 may completely overlap the first heating region HR1D defined by the plurality of first heaters 131D in the axial direction of the rotating axis RE, and thus the wafer carriers 120 do not overlap the second heating region HR2D defined by the plurality of second heaters 132D in the axial direction of the rotating axis RE. More specifically, a vertical projection of the wafer carrier 120 on the rotating stage 110 completely overlaps a vertical projection HR1DP of the first heating region HR1D on the rotating stage 110, and does not overlap a vertical projection HR2DP of the second heating region HR2D on the rotating stage 110.

It is specially noted that, in the axial direction of the rotating axis RE, the rotation track TR overlaps a vertical projection HR1DP of the first heating region HR1D on the rotating stage 110. In other words, in a rotation process of the wafer carrier 120, the symmetry center CS of the wafer carrier 120 always overlaps the vertical projection HR1DP of the first heating region HR1D on the wafer carrier 120.

In the present embodiment, each of the first heaters 131D has a first width Wa, and there is a first spacing Sa between any two adjacent first heaters 131D in the radial direction of the rotating stage 110. Each of the second heaters 132D has a second width Wb, and there is a second spacing Sb between any two adjacent second heaters 132D in the radial direction of the rotating stage 110.

It is specially noted that, the first width Wa, the second width Wb, the first spacing Sa and the second spacing Sb satisfy the equation: $Wa/(Wa+Sa) \geq Wb/(Wb+Sb)$, which may ensure the heating power of the first heating region HR1D is greater than the heating power of the second heating region HR2D, helping improve temperature uniformity of the epitaxial substrate ES, and enabling the epitaxial film TF (as illustrated in FIG. 2) developed on the epitaxial substrate ES to have favorable thickness uniformity.

In the present embodiment, there is a smallest spacing Sab between the second heaters 132D and the first heating region HR1D in the radial direction of the rotating stage 110, and the smallest spacing Sab may be equal to the second spacing Sb, but the invention is not limited thereto. In other embodiments, the smallest spacing Sab between the second heaters 132D and the first heating region HR1D may not be equal to the second spacing Sb between any two adjacent second heaters 132D, and the first width Wa, the second width Wb, the first spacing Sa and the smallest spacing Sab may satisfy the equation: $Wa/(Wa+Sa) > Wb/(Wb+Sab)$ to ensure the heating power of the first heating region HR1D is greater than the heating power of the second heating region HR2D.

In addition, the heating apparatus 100D may further includes a plurality of third heaters 133D disposed under a third heating region HR3D. In the radial direction of the rotating stage 110, the third heating region HR3D is disposed on a side of the first heating region HR1D away from the second heating region HR2D. That is, the first heaters 131D are located between the second heaters 132D and the third heaters 133D, and the second heaters 132D are located between the first heaters 131D and the rotating axis RE.

It should be noted that, at least part of the third heating region HR3D (or the third heaters 133D) does not overlap the rotating stage 110 in the axial direction of the rotating axis RE, and the wafer carriers 120 do not overlap the third heating region HR3D in the axial direction of the rotating axis RE. More specifically, a vertical projection of the wafer carriers 120 on the rotating stage 110 does not overlap a vertical projection HR3DP of the third heating region HR3D on the rotating stage 110.

Each of the third heaters has a third width Wc in the radial direction of the rotating stage 110, and there is a third spacing Sc between any two adjacent third heaters 133D in the radial direction of the rotating stage 110. The first width Wa, the third width Wc, the first spacing Sa and the third spacing Sc may satisfy the equation: $Wa/(Wa+Sa) > Wc/(Wc+Sc)$ to ensure the heating power of the first heating region HR1D is greater than the heating power of the third heating region HR3D.

In the present embodiment, there is a smallest spacing Sac between the third heaters 133D and the first heating region HR1D in the radial direction of the rotating stage 110, and the smallest spacing Sac may be equal to the third spacing Sc, but the invention is not limited thereto.

In other embodiments, the smallest spacing Sac between the third heaters 133D and the first heating region HR1D may not be equal to the third spacing Sc between any two adjacent third heaters 133D, and the first width Wa, the third width Wc, the first spacing Sa and the smallest spacing Sac may satisfy the equation: $Wa/(Wa+Sa) > Wc/(Wc+Sac)$ to ensure the heating power of the first heating region HR1D is greater than the heating power of the third heating region HR3D.

Since the distribution density of the first heaters 131D located in the first heating region HR1D, the distribution density of the second heaters 132D located in the second heating region HR2D and the distribution density of the third heaters 133D located in the third heating region HR3D are different from each other, the heater 130D may heat the wafer carrier 120 in a more uniform way to improve temperature uniformity of the epitaxial substrate ES and enabling the epitaxial film developed on the epitaxial substrate ES to have favorable thickness uniformity.

Further, there is a distance H between the heater 130D and the rotating stage 110 in the axial direction of the rotating axis RE. In the present embodiment, the distance H may be included between the rotating stage 110 and each of the first heaters 131D, the second heaters 132D and the third heaters 133D, but the invention is not limited thereto.

Figure 10:
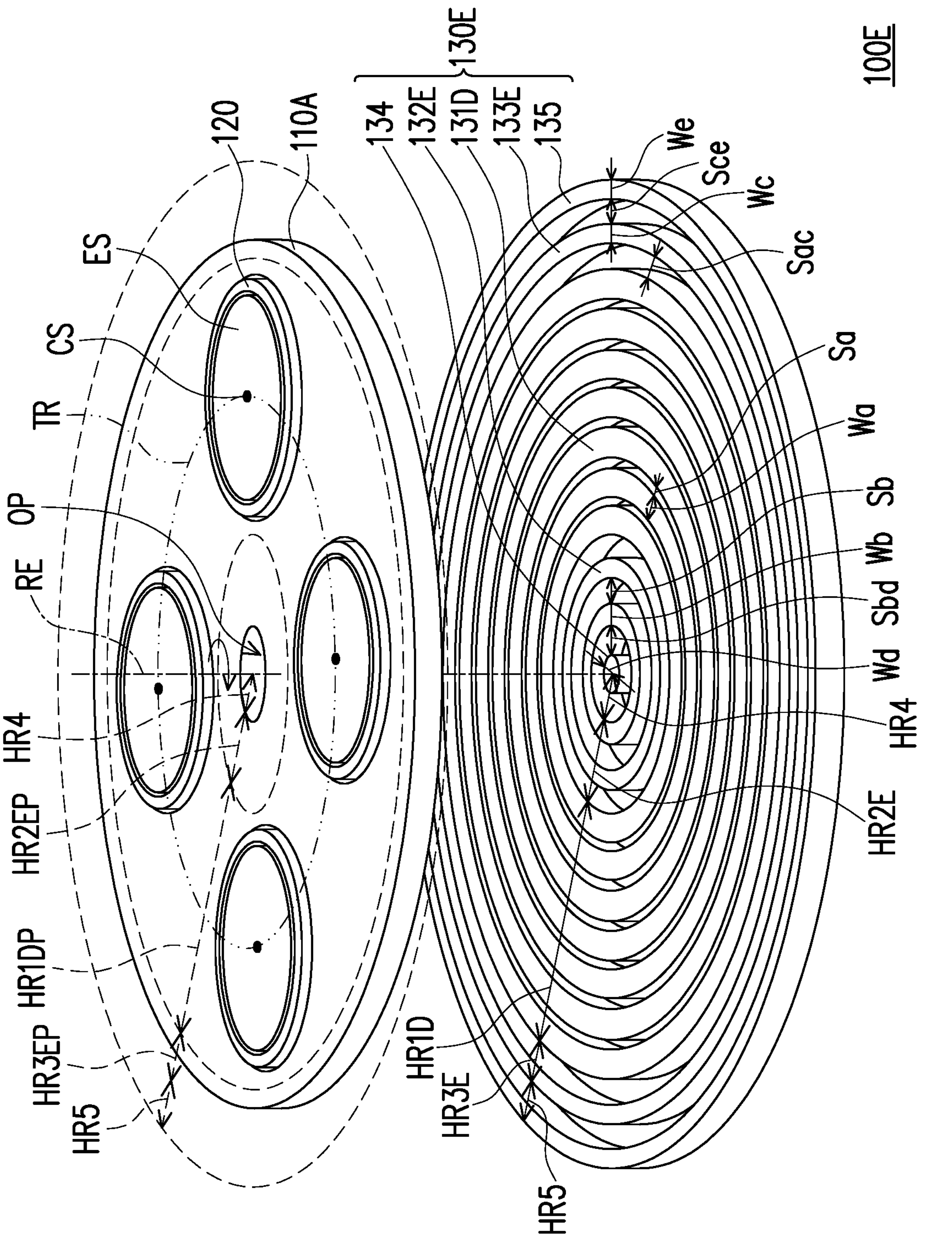
FIG. 10 is a schematic partial exploded view of a heating apparatus according to a sixth embodiment of the invention.
Figure 11:
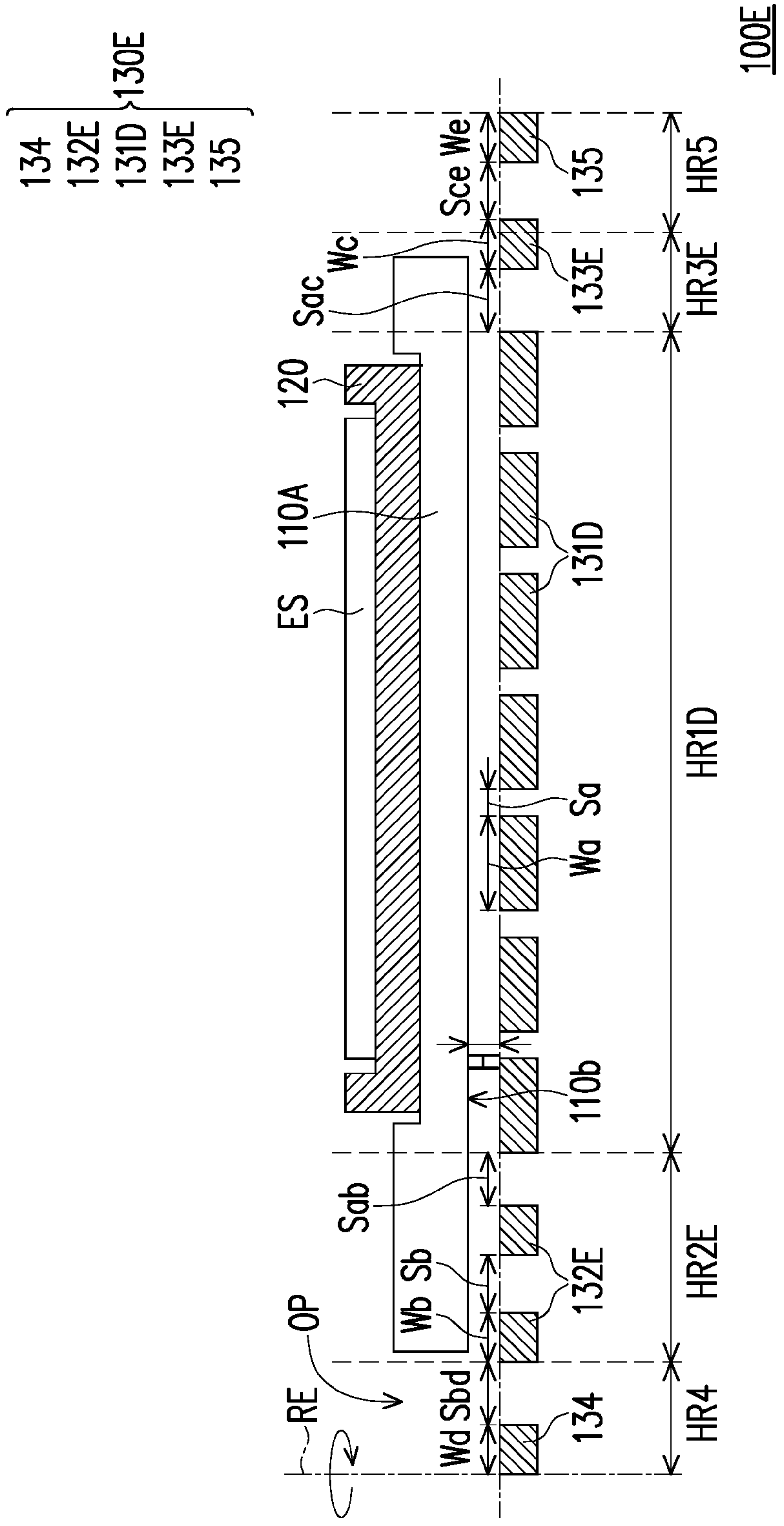
FIG. 11 is a schematic cross-sectional view of the heating apparatus in FIG. 10.

FIG. 10 is a schematic partial exploded view of a heating apparatus according to a sixth embodiment of the invention. FIG. 11 is a schematic cross-sectional view of the heating apparatus in FIG. 10. Referring to FIG. 10 and FIG. 11, a main difference between the heating apparatus 100E in the present embodiment and the heating apparatus 100D in FIG. 8 and FIG. 9 is that the heater is configured in different manners.

In the present embodiment, a configuration relationship between the first heating region HR1D provided with the first heaters 131D, the second heating region HR2E provided with the second heaters 132E, the third heating region HR3E provided with the third heaters 133E, the rotating stage 110A and the wafer carrier 120 is similar to that of the heating apparatus 100D in the foregoing embodiment, and the descriptions thereof are omitted herein.

In the present embodiment, the heating apparatus 100E may further includes at least one fourth heater 134 disposed under a fourth heating region HR4 and at least one fifth heater 135 disposed under a fifth heating region HR5. The fourth heating region HR4 is located between the second heating region HR2E and the rotating axis RE of the rotating stage 110A in the radial direction of the rotating stage 110A. The fifth heating region HR5 is located on a side of the third heating region HR3E away from the first heating region HR1D in the radial direction of the rotating stage 110A.

It should be noted that the fourth heating region HR4 and the fifth heating region HR5 do not overlap the rotating stage 110A in the axial direction of the rotating axis RE. Particularly, the rotating stage 110A of present embodiment has an opening OP disposed between the wafer carriers 120, and the rotating axis RE of the rotating stage 110A passes through the opening OP. The fourth heating region HR4 completely overlaps the opening OP of the rotating stage 110A in the axial direction of the rotating axis RE.

From another point of view, a vertical projection of the wafer carriers 120 on the rotating stage 110A completely overlaps a vertical projection HR1DP of the first heating region HR1D on the rotating stage 110A, but does not overlap a vertical projection HR2EP of the second heating region HR2E on the rotating stage 110A and a vertical projection HR3EP of the third heating region HR3E on the rotating stage 110A.

In the present embodiment, the fourth heater 134 has a fourth width Wd in the radial direction of the rotating stage 110A, and there is a smallest spacing Sbd between the fourth heater 134 and the second heating region HR2E in the radial direction of the rotating stage 110A. The fifth heater 135 has a fifth width We in the radial direction of the rotating stage 110A, and there is a smallest spacing Sce between the fifth heater 135 and the third heating region HR3E in the radial direction of the rotating stage 110A. A distance H is included between the rotating stage 110A and each of the first heaters 131D, the second heaters 132E, the third heater 133E, the fourth heater 134 and the fifth heater 135 in the axial direction of the rotating axis RE.

The second width Wb, the fourth width Wd, the second spacing Sb, the smallest spacing Sbd and the distance H may satisfy the equation: $Wb/(Wb+Sb) \geq Wd/[(Wd+Sbd).H^{n1}]$, where n1 is greater than 0, to ensure the heating power of the second heating region HR2E is greater than the heating power of the fourth heating region HR4. In the present embodiment, the smallest spacing Sab between the second heaters 132E and the first heating region HR1D may be equal to the spacing Sb between any two adjacent second heaters 132E, but the invention is not limited thereto. In other embodiments, the smallest spacing Sab and the spacing Sb may be unequal, such that the second width Wb, the fourth width Wd, the smallest spacing Sab, the smallest spacing Sbd and the distance H may satisfy the equation: $Wb/(Wb+Sab) \geq Wd/[(Wd+Sbd) \cdot H^{n1}]$ to ensure the heating power of the second heating region HR2E is greater than the heating power of the fourth heating region HR4.

In the present embodiment, similarly, the third width Wc, the fifth width We, the smallest spacing Sac and the smallest spacing Sce may satisfy the equation: $Wc/(Wc+Sac) \geq We/[(We+Sce) \cdot H^{n2}]$, where n2 is greater than 0, to ensure the heating power of the third heating region HR3E is greater than the heating power of the fifth heating region HR5.

Since the distribution density of the first heaters 131D located in the first heating region HR1D, the distribution density of the second heaters 132E located in the second heating region HR2E, the distribution density of the third heater 133E located in the third heating region HR3E, and the distribution density of the fourth heater 134 located in the fourth heating region HR4 and the distribution density of the fifth heater 135 located in the fifth heating region HR5 are different from each other, the heater 130E may heat the wafer carrier 120 in a more uniform way to improve temperature uniformity of the epitaxial substrate ES and enabling the epitaxial film developed on the epitaxial substrate ES to have favorable thickness uniformity.

Figure 12:
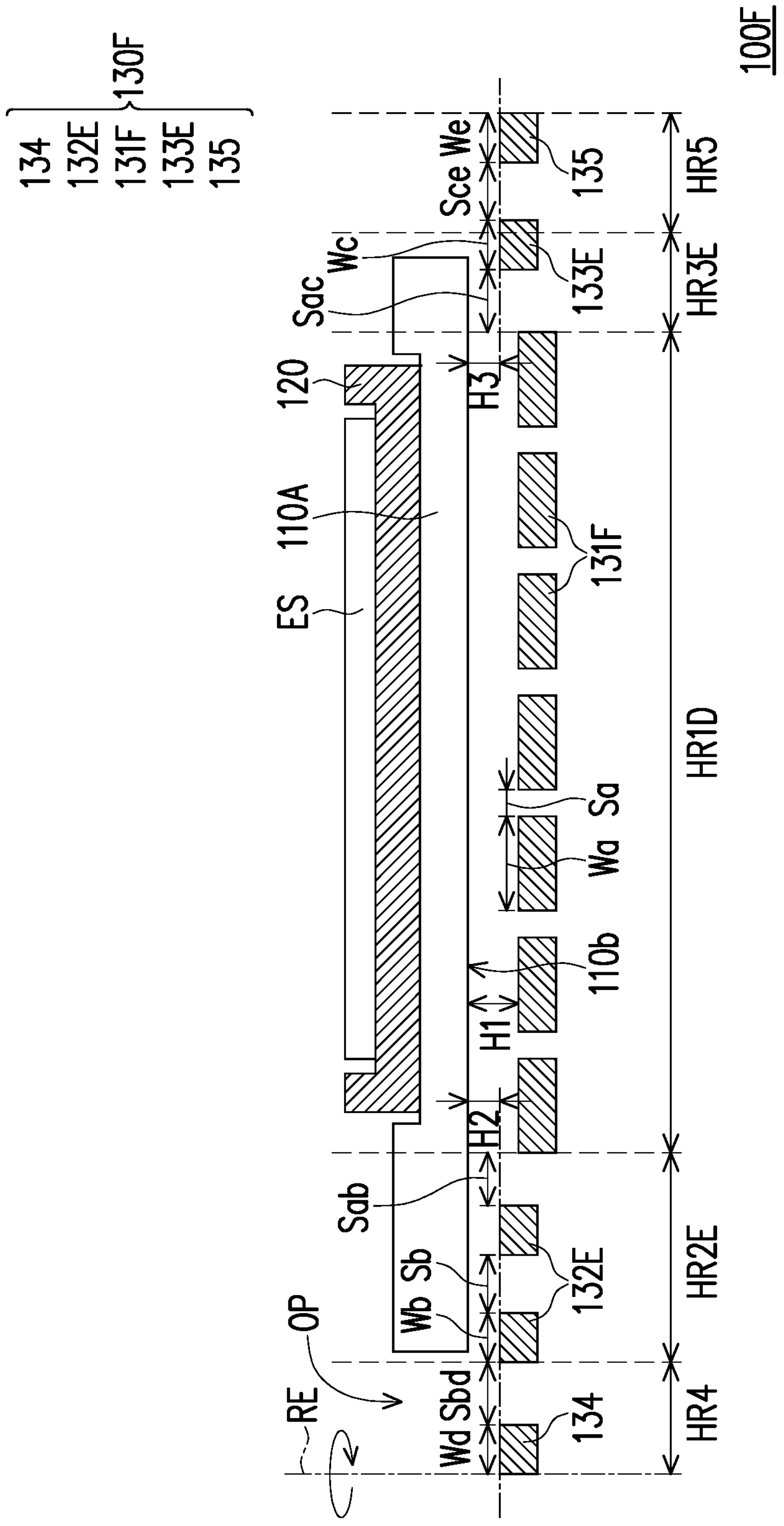
FIG. 12 is a schematic cross-sectional view of a heating apparatus according to a seventh embodiment of the invention.

FIG. 12 is a schematic cross-sectional view of a heating apparatus according to a seventh embodiment of the invention. Referring to FIG. 12, the difference between the heating apparatus 100F in the present embodiment and the heating apparatus 100E in FIG. 11 is that the heater is configured in different manners.

In the present embodiment, a distance H1 is included between the rotating stage 110A and the first heaters 131F in the axial direction of the rotating axis RE. A distance H2 is included between the rotating stage 110A and each of the second heaters 132E and the fourth heater 134 in the axial direction of the rotating axis RE. A distance H3 is included between the rotating stage 110A and each of the third heater 133E and the fifth heater 135 in the axial direction of the rotating axis RE. The distance H1 may be different from the distance H2 and the distance H3. For example, the distance H1 may be greater than the distance H2 and the distance H3.

Preferably, the smaller the distance H1 is, the bigger the spacing Sa is. Such that, the effects of air turbulence during rotation of the rotating stage 110A may be reduced.

In the present embodiment, a configuration relationship between the second heaters 132E, the third heater 133E, the fourth heater 134, the fifth heater 135, the rotating stage 110A and the wafer carrier 120 is similar to that of the heating apparatus 100E in FIG. 11, and descriptions thereof are omitted herein. Similarly, the heater 130F of the heating apparatus 100F of present embodiment may heat the wafer carrier 120 in a more uniform way to improve temperature uniformity of the epitaxial substrate ES and enabling the epitaxial film developed on the epitaxial substrate ES to have favorable thickness uniformity.

It should be understood that, the heating apparatus 100 of the CVD system 1 may be replaced with any one of the heating apparatus 100D in FIG. 8 and FIG. 9, the heating apparatus 100E in FIG. 10 and FIG. 11 and the heating apparatus 100F in FIG. 12 to further improve epitaxial quality and film uniformity.

Based on the above, in the heating apparatus and the CVD system in an embodiment of the invention, the first spacing between the two adjacent first heaters located in the first heating region is not equal to the spacing between the first heating region and the second heating region, so that the temperature uniformity of the epitaxial substrate can be effectively improved, the film developed on the epitaxial substrate may have favorable thickness uniformity, and uniformity of light emission of a subsequently formed micro light-emitting diode chip is also improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heating apparatus, comprising:

a rotating stage, comprising a rotating axis;

a plurality of wafer carriers, disposed on the rotating stage, wherein the rotating stage drives the wafer carriers to rotate on the rotating axis;

a plurality of first heaters, disposed in a first heating region, wherein there is a first spacing Sa between any two adjacent first heaters, and each of the first heaters comprises a first width Wa in a radial direction of the rotating stage;

at least one second heater, disposed in a second heating region, wherein each of the at least one second heater comprises a second width Wb in the radial direction of the rotating stage, there is a smallest spacing Sab between the at least one second heater and the first heating region, and Wa, Wb, Sa and Sab satisfy the equation: $Wa/(Wa+Sa)>Wb/(Wb+Sab)$, wherein, a vertical projection of each of the wafer carriers on the rotating stage overlaps a vertical projection of the first heating region on the rotating stage;

at least one third heater, disposed under a third heating region, wherein at least part of the third heating region does not overlap the rotating stage, the third heater comprises a third width Wc in the radial direction of the rotating stage, there is a smallest spacing Sac between the at least one third heater and the first heating region, and Wa, Wc, Sa and Sac satisfy the equation: $Wa/(Wa+Sa)>Wc/(Wc+Sac)$; and at least one fourth heater, disposed under a fourth heating region, wherein the fourth heating region does not overlap the rotating stage, the fourth heater comprises a fourth width Wd in the radial direction of the rotating stage, there is a smallest spacing Sbd between the at least one fourth heater and the second heating region, there is a distance H between the rotating stage and the at least one fourth heater in an axial direction of the rotating axis, and Wd, Sbd, Wb, Sab and H satisfy the equation: $Wb/(Wb+Sab)>Wd/[(Wd+Sbd)\cdot H^{n1}]$, where n1 is greater than 0, wherein the rotating stage further comprises an opening disposed between the wafer carriers, the rotating axis passes through the opening, and the at least one fourth heater completely overlaps the opening in the axial direction of the rotating axis.

2. The heating apparatus according to claim 1, wherein the first heating region comprises a radial width in the radial direction of the rotating stage, the wafer carrier comprises a wafer carrier diameter, and a ratio of the radial width to the wafer carrier diameter is greater than 0.5 and less than 1.

3. The heating apparatus according to claim 1, wherein the at least one second heater comprises a plurality of second heaters, there is a second spacing Sb between any two adjacent second heaters, and Wa, Wb, Sa and Sb satisfy the equation: $Wa/(Wa+Sa)\geq Wb/(Wb+Sb)$.

4. The heating apparatus according to claim 1, wherein the first heaters comprise a first temperature, the second heater comprises a second temperature, and the first temperature is not equal to the second temperature.

5. The heating apparatus according to claim 1, wherein the wafer carriers comprise a symmetry center each, and the symmetry centers overlap a vertical projection of the first heating region on the wafer carriers.

6. The heating apparatus according to claim 1, further comprising:

at least one fifth heater, disposed under a fifth heating region, wherein the fifth heating region does not overlap the rotating stage, the fifth heater comprises a fifth width We in the radial direction of the rotating stage, there is a smallest spacing Sce between the at least one fifth heater and the third heating region, and We, Sce, Wc, Sac and H satisfy the equation: $Wc/(Wc+Sac)>We/[(We+Sce)\cdot H^{n2}]$, where n2 is greater than 0.

7. The heating apparatus according to claim 1, wherein there is a distance H1 between the rotating stage and the first heaters in an axial direction of the rotating axis, there is a distance H2 between the rotating stage and the at least one second heater in the axial direction of the rotating axis, and the distance H1 is different from the distance H2.

8. A chemical vapor deposition system, comprising:

a chamber;

a heating apparatus, disposed in the chamber, wherein the heating apparatus comprises:

a rotating stage, comprising a rotating axis;

a plurality of wafer carriers, disposed on the rotating stage, wherein the rotating stage drives the wafer carriers to rotate on the rotating axis;

a plurality of first heaters, disposed in a first heating region, wherein there is a first spacing Sa between any two adjacent first heaters, and each of the first heaters comprises a first width Wa in a radial direction of the rotating stage;

at least one second heater, disposed in a second heating region, wherein each of the at least one second heater comprises a second width Wb in the radial direction of the rotating stage, there is a smallest spacing Sab between the at least one second heater and the first heating region, and Wa, Wb, Sa and Sab satisfy the equation: $Wa/(Wa+Sa)\geq Wb/(Wb+Sab)$;

at least one third heater, disposed under a third heating region, wherein at least part of the third heating region does not overlap the rotating stage, the third heater comprises a third width Wc in the radial direction of the rotating stage, there is a smallest spacing Sac between the at least one third heater and the first heating region, and Wa, Wc, Sa and Sac satisfy the equation: $Wa/(Wa+Sa)\geq Wc/(Wc+Sac)$; and at least one fourth heater, disposed under a fourth heating region, wherein the fourth heating region does not overlap the rotating stage, the fourth heater comprises a fourth width Wd in the radial direction of the rotating stage, there is a smallest spacing Sbd between the at least one fourth heater and the second heating region, there is a distance H between the rotating stage and the at least one fourth heater in an axial direction of the rotating axis, and Wd, Sbd, Wb, Sab and H satisfy the equation: $Wb/(Wb+Sab)>Wd/[(Wd+Sbd)\cdot H^{n1}]$, where n1 is greater than 0, wherein the rotating stage further comprises an opening disposed between the wafer carriers, the rotating axis passes through the opening, and the at least one fourth heater completely overlaps the opening in the axial direction of the rotating axis;

a rotation driving mechanism, connected to the rotating stage and driving the rotating stage to rotate; and an air inlet unit, disposed in the chamber and located above the rotating stage;

wherein, a vertical projection of each of the wafer carriers on the rotating stage overlaps a vertical projection of the first heating region on the rotating stage.

9. The chemical vapor deposition system according to claim 8, wherein the at least one second heater comprises a plurality of second heaters, there is a second spacing Sb between any two adjacent second heaters, and Wa, Wb, Sa and Sb satisfy the equation: $Wa/(Wa+Sa)\geq Wb/(Wb+Sb)$.

10. The chemical vapor deposition system according to claim 8, wherein the first heaters comprise a first temperature, the second heater comprises a second temperature, and the first temperature is not equal to the second temperature.

11. The chemical vapor deposition system according to claim 8, wherein the heating apparatus further comprises:

at least one fifth heater, disposed under a fifth heating region, wherein the fifth heating region does not overlap the rotating stage in the axial direction of the rotating axis, the fifth heater comprises a fifth width We in the radial direction of the rotating stage, there is a smallest spacing Sce between the at least one fifth heater and the third heating region, and We, Sce, Wc, Sac and H satisfy the equation: $Wc/(Wc+Sac)>We/[(We+Sce)\cdot H^{n2}]$, where n2 is greater than 0.

12. The chemical vapor deposition system according to claim 8, wherein there is a distance H1 between the rotating stage and the first heaters in an axial direction of the rotating axis, there is a distance H2 between the rotating stage and the at least one second heater in the axial direction of the rotating axis, and the distance H1 is different from the distance H2.

* * * * *